(12) United States Patent
Drake et al.

(10) Patent No.: US 6,404,649 B1
(45) Date of Patent: Jun. 11, 2002

(54) PRINTED CIRCUIT BOARD ASSEMBLY WITH IMPROVED BYPASS DECOUPLING FOR BGA PACKAGES

(75) Inventors: Michael Drake; Chris Tressler; Edward Guerrero, all of Austin; Greg Schelling, San Antonio; John Bennett, Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/518,491

(22) Filed: Mar. 3, 2000

(51) Int. Cl.⁷ .................................................. H05K 7/06
(52) U.S. Cl. ........................ 361/782; 361/760; 257/724; 29/832
(58) Field of Search .............................. 361/306.2, 734, 361/760, 763, 765–768, 782, 783, 803, 738; 257/686, 723, 724, 737, 738, 777, 778, 786; 438/106, 108, 109, 125; 29/832, 837, 840, 841

(56) References Cited

U.S. PATENT DOCUMENTS

| | | | |
|---|---|---|---|
| 4,734,818 A | * 3/1988 | Hernandez et al. | 361/306.2 |
| 4,779,164 A | * 10/1988 | Menzies, Jr. et al. | 361/734 |
| 4,853,826 A | * 8/1989 | Hernandez | 361/306.2 |
| 4,885,841 A | * 12/1989 | McNabb | 29/840 |
| 5,010,447 A | * 4/1991 | Wallace | 361/782 |
| 5,272,590 A | * 12/1993 | Hernandez | 361/306.2 |
| 5,654,676 A | * 8/1997 | Avanic et al. | 361/763 |
| 5,656,856 A | * 8/1997 | Kweon | 257/686 |
| RE35,733 E | * 2/1998 | Hernandez et al. | 361/734 |
| 5,751,555 A | * 5/1998 | Pfizenmayer et al. | 257/724 |
| 5,798,567 A | * 8/1998 | Kelly et al. | 257/723 |
| 5,939,782 A | * 8/1999 | Malladi | 257/723 |
| 5,973,928 A | * 10/1999 | Blasi et al. | 361/760 |
| 5,996,880 A | * 12/1999 | Chu et al. | 361/782 |
| 6,144,559 A | * 11/2000 | Johnson et al. | 361/760 |
| 6,272,020 B1 | * 8/2001 | Tosaki et al. | 361/763 |

FOREIGN PATENT DOCUMENTS

| | | |
|---|---|---|
| GB | 2176654 A | 4/1986 |
| JP | 09082557 | 3/1997 |
| JP | 09102432 | 4/1997 |
| JP | 09223861 | 8/1997 |
| JP | 10084011 | 3/1998 |

OTHER PUBLICATIONS

Tentative data sheet for "Sheet Capacitor" by Matsushita Electric Industrial Co., Ltd., Electronic Circuit Capacitor Division, Ver. 3.0, 6 pgs.

Tentative data sheet for "Sheet Capacitor" by by Matsushita Electric Industrial Co., Ltd., Electronic Circuit Capacitor Division, Ver. 2.2, 5 pgs.

"Directly Attached Decoupling Capacitors and Fabrication Process", IBM Technical Disclosure Bulletin, vol. 32, No. 6B, Nov. 1989, pp. 330–331, IBM Corp. Armonk, NY.

International Search Report, application number PCT/US00/31960, mailed May 3, 2001.

* cited by examiner

*Primary Examiner*—David L. Talbott
*Assistant Examiner*—John B. Vigushin
(74) *Attorney, Agent, or Firm*—Conley, Rose & Tayon, PC

(57) ABSTRACT

A printed circuit board assembly with improved bypass decoupling for BGA packages. In one embodiment, a capacitor may be interposed between a BGA package and a PCB within a perimeter of the contact pads that form a BGA footprint. The capacitor may have physical dimensions which allow a BGA package to be mounted such that there is no physical contact between the capacitor and the BGA.

26 Claims, 6 Drawing Sheets

PRINTED CIRCUIT BOARD ASSEMBLY WITH IMPROVED BYPASS DECOUPLING FOR BGA PACKAGES

BACKGROUND OF THE INVENTION

1. Field of the Invention

This invention relates to printed circuit board assemblies, and more particularly, to the use of thin decoupling capacitors in conjunction with ball-grid array (BGA) packages.

2. Description of the Relevant Art

Decoupling capacitors are used in electronic circuits to filter out transients in their associated power distribution systems. Transients such as voltage spikes and momentary voltage drops may have adverse affects on various circuits, and may possibly cause erroneous operation. Transients may often times be filtered out of a power distribution system by the use of capacitors (this is often referred to as decoupling). When electrically connected between a power line and an electrical ground, a capacitor will tend to filter out many transients, as the voltage across a capacitor cannot change instantaneously.

The amount of capacitance necessary for effective elimination of power system transients can vary based on several different factors. One such factor is the frequency of operation of the circuits for which decoupling is to be provided. Circuits which operate at higher frequencies, such as some radio circuits and high-speed computer systems, may produce more transients than low frequency or DC circuits. Furthermore, some high frequency circuits may produce a number of harmonics or sub-harmonics, which may result in transients at different frequencies.

Another factor which may affect the amount of capacitance required for effective decoupling is the distance between the circuits and the decoupling capacitors. Various factors may affect the placement of decoupling capacitors on a printed circuit board (PCB). One such factor is the packaging used for integrated circuits (IC's) mounted on the PCB. Some types of packaging, in conjunction with other PCB layout constraints, may result in decoupling capacitors being placed a significant distance from their associated circuits. As the distance between the decoupling capacitors and associated circuits increase, inductance from the circuit lines connecting the capacitors to the packaging (known as Equivalent Series Inductance, or ESL) may become a problem. ESL provides an inductive element to the impedance between a power line and electrical ground, and may thus reduce the effect of the capacitive impedance. Thus, capacitors of greater value (or a greater number of capacitors) may be required to overcome the effects of ESL.

The use of ball-grid array (BGA) integrated circuit packages may add further complications to the problem of providing decoupling capacitance. FIGS. 1A and 1B illustrate two possible BGA configurations. Each drawing illustrates a view of the BGA from the bottom side (i.e. the side that mounts to the PCB). In FIG. 1A, the BGA shown includes a plurality of electrical contacts in-a "ring" arrangement near the peripheries of the package. A plurality of electrical contacts is also located in the center of the package, with an open space in between. Typically, electrical contacts for conveying power in this type of BGA are located on the inner portion of the ring, with ground contacts located in the center. FIG. 1B illustrates a similar BGA arrangement, minus the central group of electrical contacts. In this arrangement, power and ground contacts are typically located on the inner portion of the ring. Both types of BGA's may be mounted to corresponding contact pads on a PCB. The plurality of contact pads to which a BGA is mounted is sometimes referred to as a "footprint".

Typically, decoupling capacitance is provided for BGA's through the use of one or more surface mounted capacitors. If the decoupling capacitors are mounted on the same side of the PCB as the BGA, they will typically be placed some distance away from the power and ground pins of the BGA package. In such cases, a greater number of capacitors may be required to overcome the effects of ESL. As an alternative, ESL may be minimized by mounting the decoupling capacitors nearer the power and ground contacts of the BGA, but on the opposite side of the PCB. While this alternative may reduce the effects of ESL, it may add complexity to the assembly of the finished product. By placing capacitors on the opposite side of the PCB, extra soldering operations may be required. Furthermore, gluing operations to secure the capacitors to the PCB prior to soldering may be required as well. The extra manufacturing operations may result in a significant increase in the cost of the finished product, and increase the likelihood of defects during the assembly process.

SUMMARY OF THE INVENTION

The problems outlined above may in large part be solved by a printed circuit board assembly with improved bypass decoupling for BGA packages, in accordance with the present invention. In one embodiment, a capacitor may be interposed between a BGA package and a PCB within a perimeter of the contact pads that form a BGA footprint. The capacitor may have physical dimensions which allow a BGA package to be mounted such that there is no physical contact between the capacitor and the BGA.

In one embodiment, the capacitor used is an thin capacitor, with a thickness of no more than 0.5 millimeters. The small thickness of the capacitor may allow it to be easily interposed between a BGA and a PCB.

One embodiment of the thin capacitor has no leads. Terminals located on the capacitor package may be soldered directly to the appropriate contact pads on the PCB. Since the package is leadless, equivalent series inductance (ESL) may be minimized. In some cases, the minimization of ESL may result in the need for fewer capacitors to effectively decouple a BGA package.

In various embodiments, multiple capacitors may be embodied within a common package. For example, in one embodiment an ultra-thin capacitor package includes two capacitors which differ in capacitance value by a factor of 10. By using packages with multiple capacitors, power system transients occurring at different frequencies may be effectively filtered out.

Thus, in various embodiments, improved bypass decoupling for BGA packages may be accomplished by interposing thin capacitors (or capacitor packages) between a BGA and a PCB. By interposing capacitors between a BGA and the PCB, some manufacturing operations may be eliminated which may result in cost reductions to the finished product. The use of leadless capacitor packages may help minimize ESL and thus allow the use of fewer capacitors to effectively decouple a BGA. The use of capacitor packages with multiple capacitors may allow the effective filtering of transients occurring at different frequencies. The use of open space under a BGA may allow for more efficient utilization of circuit board area for other components.

BRIEF DESCRIPTION OF THE DRAWINGS

Other objects and advantages of the invention will become apparent upon reading the following detailed description and upon reference to the accompanying drawings in which.

Figure 1A:
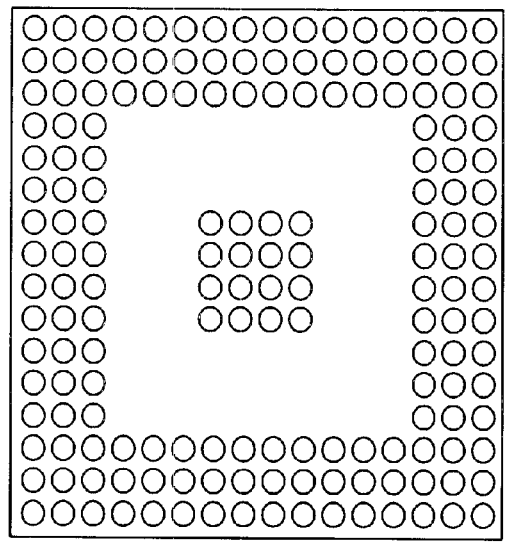
FIG. 1A (Prior art) is a view of the underside of one embodiment of a ball-grid array (BGA) package.
Figure 1B:
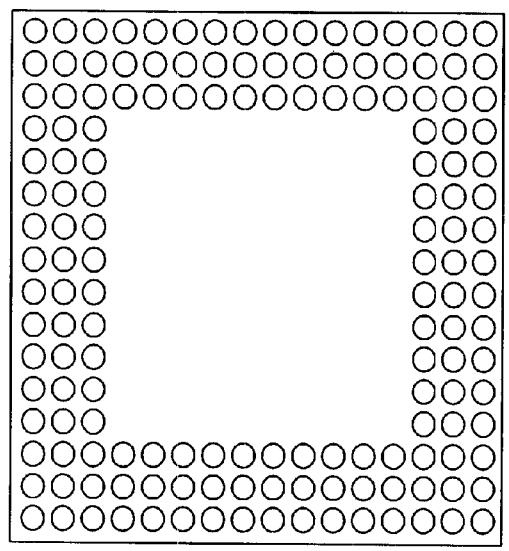
FIG. 1B (Prior art) is a view of the underside of another embodiment of a BGA package.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined be the appended claims.

DETAILED DESCRIPTION OF THE INVENTION

Figure 2:
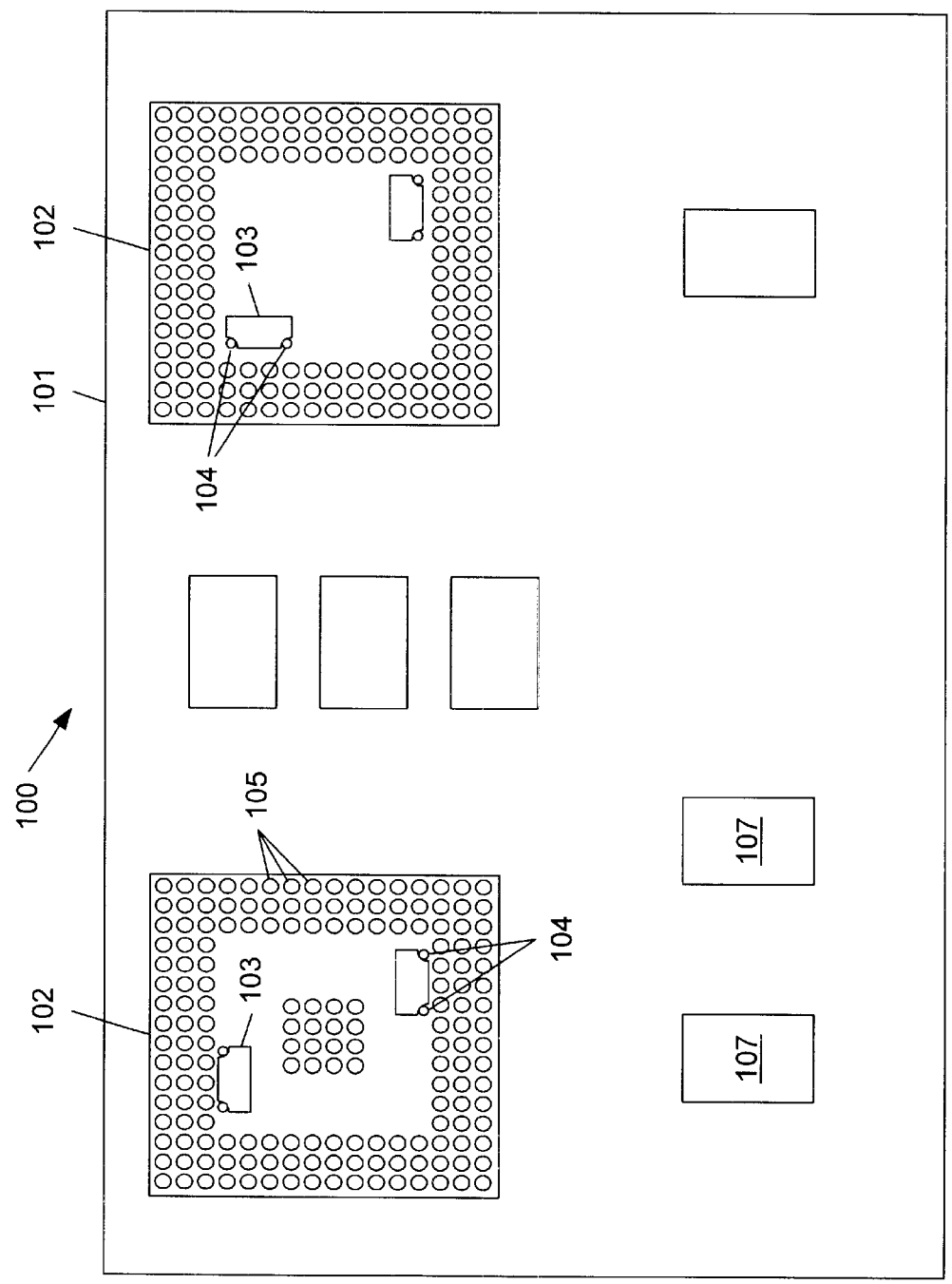
FIG. 2 is a drawing illustrating a view of the placement of one embodiment of a thin capacitor within a BGA footprint.

Turning now to FIG. 2, a drawing illustrating a view of the placement of one embodiment of a thin capacitor within a BGA footprint is shown. Printed circuit assembly (PCA) 100 includes printed circuit board (PCB) 101. PCB 101 includes two BGA footprints 102, each of which is formed by a plurality of contact pads 105. A plurality of chips 107 is mounted upon PCB 101. Mounted within the periphery of each BGA footprint are capacitors 103. Each capacitor 103 is a thin capacitor that may be interposed between a BGA and PCB 101. Capacitors 103 may be physically and electrically connected to PCB 101 by soldering them to additional contact pads 104, which are located within the periphery of the BGA footprint formed by contact pads 105. Capacitors 103 may be electrically coupled to a power distribution line at one terminal and a ground at the other terminal. In the embodiment shown, capacitors 103 do not have leads, and thus are soldered to contact pads 104 via terminals located on the body of the capacitor packaging. Capacitors 103 provide decoupling for BGA packages that may be mounted to contact pads 105 of BGA footprints 102, and may be effective in filtering out power system transients. Various alternate embodiments may use more than two capacitors per BGA (as shown in the drawing), while others may use only one.

Figure 3:
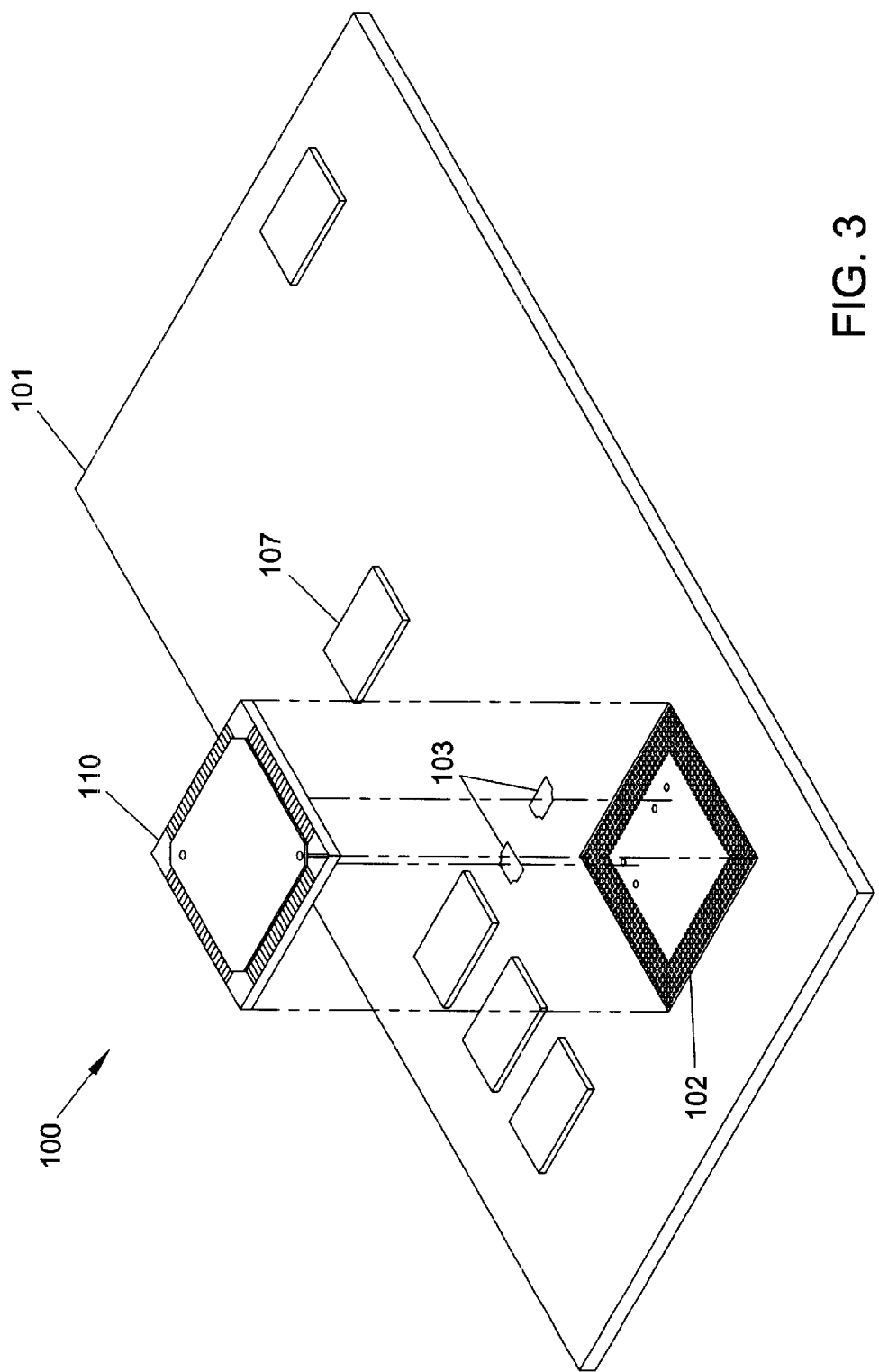
FIG. 3 is a drawing of a printed circuit board (PCB) illustrating the mounting of capacitors under a BGA in one embodiment.

Moving now to FIG. 3, a drawing of a printed circuit board (PCB) illustrating the mounting of capacitors under a BGA in one embodiment is shown. During assembly operations, capacitors 103 may be mounted to PCB 101. Terminals on capacitors 103 may be soldered to contact pads 104, which are located within the periphery of BGA footprint 102 in this embodiment. Contact pads 104 are also located on the same surface of PCB 101 as contact pads 105. BGA footprint 102 is formed by a plurality of contact pads 105. In some embodiments, capacitors 103 may be secured to PCB 101 by an adhesive prior to soldering. Following the placement of capacitors 103, BGA 110 may be placed on PCB 101, aligning it with contact pads 105 of BGA footprint 102. When BGA 110 has been properly placed, a soldering operation may be used to physically and electrically connect BGA 110 to PCB 101. In some embodiments, a single soldering operation may be used to solder both BGA 110 and capacitors 103 to their respective contact pads, while separate soldering operations may be used in other embodiments.

Figure 4:
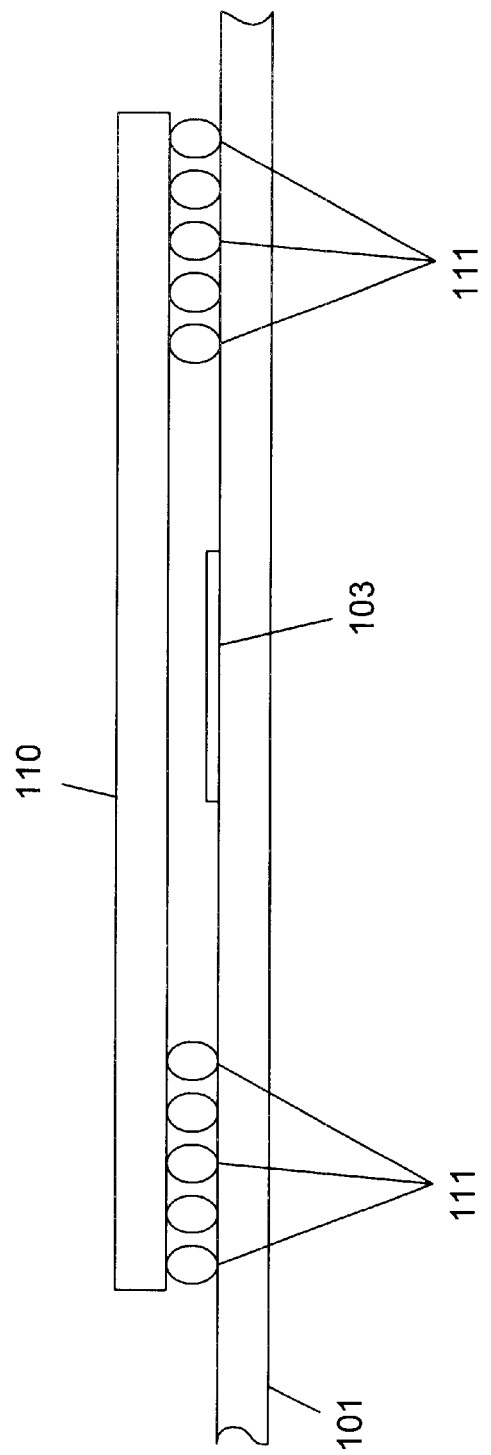
FIG. 4 is a side view of one embodiment of an ultra-thin capacitor mounted upon a PCB and interposed between a BGA and the PCB upon which it is mounted.

FIG. 4 is a side view of one embodiment of a thin capacitor mounted upon a PCB and interposed between a BGA and the PCB upon which it is mounted. Capacitor 103 may be mounted to PCB 101 as described with reference to FIG. 2 and FIG. 3. BGA 110 is also mounted to PCB 101. Electrical contacts 111 may be used to couple BGA 110 to PCB 101. In the embodiment shown, each electrical contact 111 includes a pre-formed ball of solder that may be used to solder the BGA to contact pads such as those shown in FIG. 2. Because of the small thickness of capacitor 103 may be mounted on the same surface as BGA 110, and thus interposed between BGA 110 and PCB 101. Typically, the thickness of the type of capacitors used in the embodiment shown are no more than 0.5 millimeters, and may be significantly less.

Figure 5A:
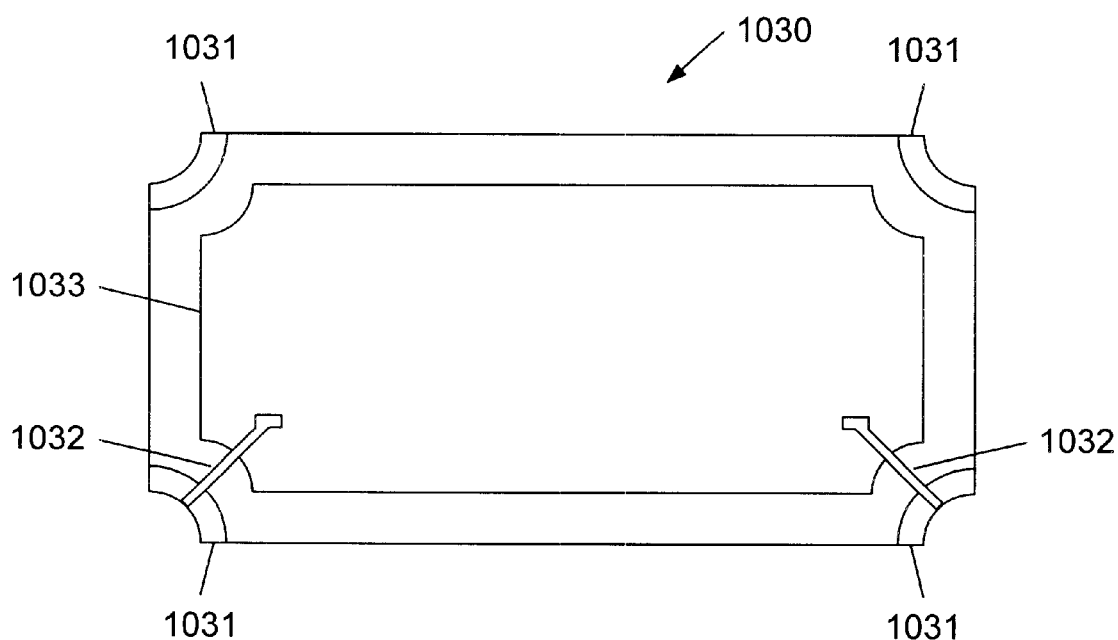
FIG. 5A is a top view of one embodiment of a thin capacitor package which may be interposed between a PCB and a BGA.
Figure 5B:
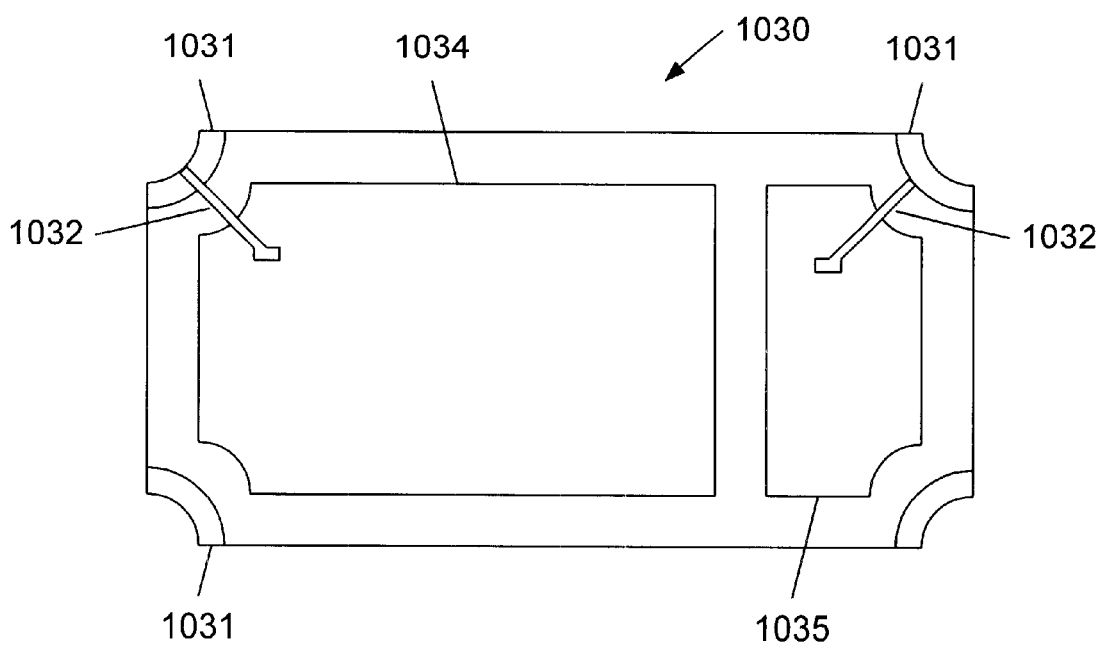
FIG. 5B is a bottom view of the thin capacitor package of FIG. 5A.

FIGS. 5A and 5B illustrate a top view and a bottom view, respectively, of one embodiment of a capacitor package 1030 that may be used in various embodiments. Capacitor package 1030 includes a plurality of contact terminals 1031, which may include exposed metal suitable for soldering to a contact pad on a PCB. Metal may be exposed on both sides of the terminals in some embodiments, which may allow for a more secure solder connection between the capacitor package and the contacts of the PCB. In the embodiment shown in FIG. 5A, two of contact terminals 1031 are electrically connected to a capacitor plate 1033 by conductors 1032. Conductors 1032 provide an electrical connection between a contact terminal 1031 and capacitor plate 1033. Alternate embodiments of the capacitor package may be constructed such that a capacitor plate makes direct contact with a contact terminal, thus eliminating the need for a conductor such as that shown here.

Capacitor plates 1034 and 1035 are shown in FIG. 5B, which is a bottom view of the capacitor package 1030. Each of these capacitor plates is electrically connected to a terminal 1031 by a conductor 1032. Since there are two separate capacitor plates present on the bottom side, capacitor package 1030 essentially includes two capacitors. Each capacitor in this embodiment is a two-plate capacitor, with the capacitor plates shown in FIG. 5B each forming a capacitor with capacitor plate 1033 shown in FIG. 5A. The capacitor plates may be separated by a dielectric material, as will be explained in further detail below.

Some embodiments of capacitor package may include only a single capacitor, while others may include more than two capacitors. Furthermore, capacitor packages may include a network of several capacitors of equal capacitance, or multiple capacitors with different values of capacitance. Since the area of capacitor plate 1034 is greater than that of capacitor plate 1035, its capacitance value will also be greater as well. In one embodiment, the capacitance values of two capacitors in a package may differ by a factor of 10. By decoupling in a "decade" fashion such as this, different frequencies may be filtered out when power system transients occur. The capacitors shown in this embodiment have a tolerance value of ±20%, although greater or lesser tolerance values may be present in other embodiments.

Figure 5C:
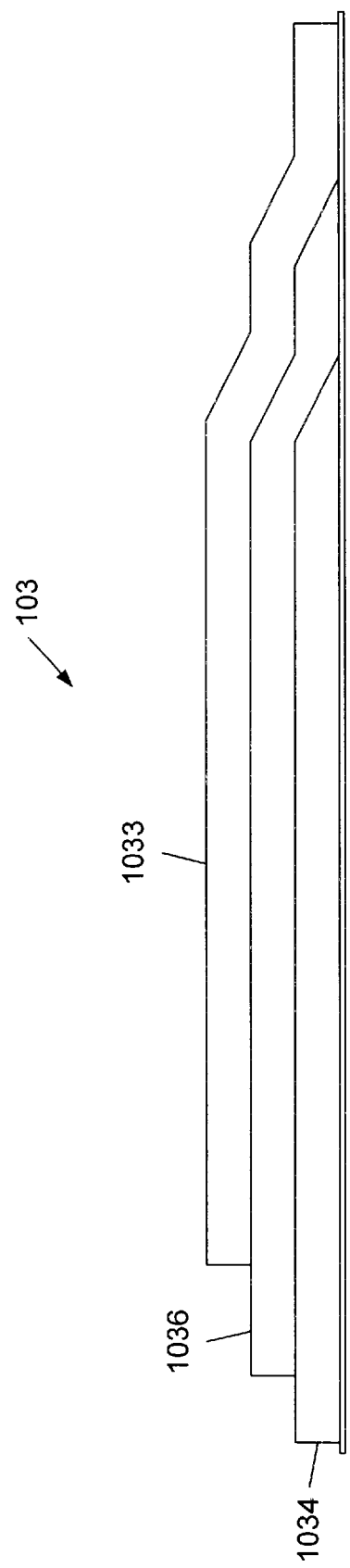
FIG. 5C is a side view of a capacitor such as those contained in the capacitor package illustrated in FIGS. 5A and 5B.

Moving now to FIG. 5C, a side view of a capacitor such as those contained in the capacitor package illustrated in FIGS. 5A and 5B is shown. It should be noted that the dimensions as shown in this drawing are exaggerated for clarity, and are not intended to represent the actual dimensions of the various embodiments. Capacitor 103 is a capacitor in a standard two-plate configuration including capacitor plates 1033 and 1034. Each capacitor plate may be formed from an electrically conductive material. Capacitor plates 1033 and 1034 are separated by a dielectric layer 1036. Dielectric layer 1036 may be formed from any suitable dielectric material.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A printed circuit board assembly comprising:
   a printed circuit board (PCB), wherein said PCB includes a plurality of contact pads which forms a ball grid array (BGA) footprint;
   a BGA package having a plurality of contacts electrically connected to said plurality of contact pads;
   a capacitor interposed between said PCB and said BGA package;
   wherein said plurality of contact pads are located on a first surface of said PCB, and wherein said capacitor is connected to additional contact pads located on said first surface of said PCB; and
   wherein said BGA and said capacitor are mounted to a common substantially planar surface of said PCB.

2. The printed circuit board assembly as recited in claim 1, wherein said additional contact pads are located within an area defined by a perimeter of said BGA footprint.

3. The printed circuit board assembly as recited in claim 2, wherein said capacitor is a leadless capacitor.

4. The printed circuit board assembly as recited in claim 3, wherein said capacitor is contained within a capacitor package.

5. The printed circuit board assembly as recited in claim 4, wherein said capacitor package includes a first capacitor and a second capacitor.

6. The printed circuit board assembly as recited in claim 5, wherein said first capacitor and said second capacitor have different capacitance values.

7. The printed circuit board assembly as recited in claim 6, wherein capacitance values of said first capacitor and said second capacitor differ by a factor of 10.

8. The printed circuit board assembly as recited in claim 3, wherein said capacitor is no more than 0.5 millimeters in thickness.

9. The printed circuit board assembly as recited in claim 3, wherein said capacitor has a tolerance of ±20%.

10. A method for providing decoupling capacitance for a ball-grid array (BGA) package including a plurality of electrical contacts, the method comprising:
    mounting a capacitor on a printed circuit board (PCB), wherein said PCB includes a plurality of contact pads which forms a ball grid array (BGA) footprint;
    mounting said BGA package to said PCB, wherein said electrical contacts are electrically connected to said plurality of contact pads, wherein said capacitor is interposed between said BGA and said PCB, and further wherein said BGA and said capacitor are mounted to a common substantially planar surface of said PCB.

11. The method as recited in claim 10, wherein said plurality of contact pads are located on a first surface of said PCB, and wherein said capacitor is connected to additional contact pads located on said first surface of said PCB.

12. The method as recited in claim 11, wherein said additional contact pads are located within an area defined by a perimeter of said BGA footprint.

13. The method as recited in claim 12, wherein said capacitor is a leadless capacitor.

14. The method as recited in claim 13, wherein said capacitor is contained within a capacitor package.

15. The method as recited in claim 14, wherein said capacitor package includes a first capacitor and a second capacitor.

16. The method as recited in claim 15, wherein said first capacitor and said second capacitor have different capacitance values.

17. The method as recited in claim 16, wherein capacitance values of said first capacitor and said second capacitor differ by a factor of 10.

18. The method as recited in claim 13, wherein said capacitor is no more than 0.5 millimeters in thickness.

19. The method as recited in claim 13, wherein said capacitor has a tolerance of ±20%.

20. A printed circuit board assembly comprising:
    a printed circuit board (PCB), wherein said PCB includes a plurality of contact pads which forms a ball grid array (BGA) footprint;
    a BGA package having a plurality of contacts electrically connected to said plurality of contact pads;
    a capacitor interposed between said PCB and said BGA package;
    wherein said plurality of contact pads are located on a first surface of said PCB, and wherein said capacitor is connected to additional contact pads located on said first surface of said PCB; and
    wherein said capacitor is no more than 0.5 millimeter in thickness.

21. The printed circuit board assembly as recited in claim 20, wherein said additional contact pads are located within an area defined by a perimeter of said BGA footprint.

22. The printed circuit board assembly as recited in claim 20, wherein said capacitor is a leadless capacitor.

23. A printed circuit board assembly comprising:
    a printed circuit board (PCB), wherein said PCB includes a plurality of contact pads which forms a ball grid array (BGA) footprint;
    a BGA package having a plurality of contacts electrically connected by soldering material to said plurality of contact pads;
    a capacitor interposed between said PCB and said BGA package;
    wherein said plurality of contact pads are located on a first surface of said PCB, and wherein said capacitor is connected to additional contact pads located on said first surface of said PCB; and
    wherein said capacitor is no thicker than the height of the soldering material.

24. The printed circuit board assembly as recited in claim 23, wherein said capacitor is no more than 0.5 millimeters in thickness.

25. The printed circuit board assembly as recited in claim 23, wherein said additional contact pads are located within an area defined by a perimeter of said BGA footprint.

26. The printed circuit board assembly as recited in claim 23, wherein said capacitor is a leadless capacitor.

* * * * *